United States Patent [19]
Sokoler

[11] Patent Number: 5,917,867
[45] Date of Patent: Jun. 29, 1999

[54] METHOD AND APPARATUS FOR DC COMPENSATION

[75] Inventor: Izydor Sokoler, Kobenhavn K, Denmark

[73] Assignee: Nokia Mobile Phones Limited, Salo, Finland

[21] Appl. No.: 08/798,353

[22] Filed: Feb. 7, 1997

[30] Foreign Application Priority Data

Feb. 8, 1996 [GB] United Kingdom ............... 9602584

[51] Int. Cl.$^6$ .................................................. H04B 1/10
[52] U.S. Cl. .................................................. 375/350
[58] Field of Search ........................ 375/319, 286, 375/287, 292, 317, 320, 350; 330/259; 455/295, 296, 298, 299, 309, 311, 312, 334, 337

[56] References Cited

U.S. PATENT DOCUMENTS

| | | | |
|---|---|---|---|
| 4,339,727 | 7/1982 | Kage et al. ............................. | 329/106 |
| 4,653,017 | 3/1987 | Colbeck et al. ....................... | 364/825 |
| 4,873,702 | 10/1989 | Chiu . | |
| 5,128,966 | 7/1992 | Bang ...................................... | 375/273 |
| 5,697,085 | 12/1997 | Birth et al. ............................. | 455/296 |

FOREIGN PATENT DOCUMENTS

| | | |
|---|---|---|
| 0 364 273 | 4/1990 | European Pat. Off. . |
| 0 474 615 | 3/1992 | European Pat. Off. . |
| 0 643 475 | 3/1995 | European Pat. Off. . |
| 0 669 739 | 8/1995 | European Pat. Off. . |
| 2215544 | 9/1989 | United Kingdom . |
| 2274759 | 2/1993 | United Kingdom .................. 375/319 |
| 2274759 | 8/1994 | United Kingdom . |
| WO 91/05427 | 4/1991 | WIPO . |

Primary Examiner—Don N. Vo
Attorney, Agent, or Firm—Perman & Green, LLP

[57] ABSTRACT

A DC compensation module for suppressing the DC content of a signal containing a periodic sequence comprises a signal transport path (10), a signal compensation path (13) and a combination unit (11). The signal transport path (10) transfers the signal from the input of the module to an input on the combination unit (11). The signal compensation path (13) is coupled to another input on the combination unit (11), and is provided with a low pass filter (14; 17) filtering a signal transferred via the signal compensation path (13). The low pass filter (14; 17) of the signal compensation path (13) is provided with a notch (20) at a frequency corresponding to the period of the periodic signal. The combination unit (11) supplies a signal in response to the difference between the signals received from the signal transport path (10) and from the signal compensation path (13).

17 Claims, 3 Drawing Sheets

METHOD AND APPARATUS FOR DC COMPENSATION

BACKGROUND OF THE INVENTION

The invention concerns a DC compensation module for suppressing the DC content of a signal containing a periodic sequence, said module comprising a signal transport path, a signal compensation path and a combination unit.

Due to the frequency inaccuracy between portable and fixed parts, component spreading, temperature drift, etc. a DC component will be present at the output of the FM discriminator in a cordless telephone system, such as a DECT system. This DC component must be removed before the signal arrives at a comparator. Otherwise, the bit error rate will increase dramatically.

SUMMARY OF THE INVENTION

The invention provides a DC compensation module which suppresses the DC content of a signal containing a periodic sequence. The DC compensation module comprises a signal transport path, a signal compensation path and a combination unit. The signal transport path transfers the signal from the input of the module to an input on the combination unit. The signal compensation path is coupled to another input on the combination unit and is provided with a low pass filter which filters a signal transferred via the signal compensation path. The low pass filter of the signal compensation path is provided with a notch at a frequency corresponding to the period of the periodic signal. The combination unit supplies a signal in response to the difference between the signals received from the signal transport path and from the signal compensation path. The presence of the notch in the low pass filter of the signal compensation path ensures that the frequency of the periodic signal is suppressed significantly or is removed completely, whereby the DC compensation module will have a transfer characteristic such that said frequency will be transferred without significant attenuation. Thus, the DC compensation module of the invention may have a large band width so that DC compensation may be achieved very quickly—right down to a few periods for the periodic signal.

This is of considerable importance in a DECT receiver, where the DC compensation module is placed between an FM discriminator and a comparator. The DC compensation module must be fast and precise within the first part of the preamble.

This characteristic is achieved in a preferred embodiment by subtracting the compensation signal from the transported signal. When the low pass filter of the signal compensation is a 2nd order low pass filter, good balance is ensured between the desirability of low filter cut-off frequency to remove the DC component and the desirability of fast module transient time.

When, in a preferred embodiment, the DC compensation module of the invention is implemented with the low pass filter in a feedback structure, the filter, in a preferred embodiment which is useful in connection with the DECT system, may have a transfer function: $H(s)=k_1(s-z_1)(s-z_1^*)/s(s-p_1)(s-p_2)$, where $k_1$ is a real constant, $z_1$ is an imaginary zero, $z_1^*$ is the complex conjugate of $z_1$, and $p_1$ and $p_2$ are two real values representing the poles of the filter. When $z_1=3.62\times10^6$, the notch will be positioned around 576 kHz.

Instead of being loop filter (feedback) implemented, the DC compensation module of the invention may be implemented by means of a feed forward filter. In this case, the compensation module comprises a branch means which supplies the received signal to the signal transport path and to the signal compensation path, and then the signals are joined again on the input of the subtraction unit, where the difference is determined. If the same effect is to be achieved with the feed forward principle as with the feedback principle, the transfer function of the filter may be designed so that $H_1(s)=H(s)/(1-H(s))$, where $H(s)$ is the filter transfer function used in the feedback principle.

In connection with a DECT signal, where data are transmitted in time slot frames, data are begun in these frames with sixteen alternating bits (preamble) followed by a sync word consisting of sixteen bits in a well-known bit pattern and data in the form of a sequence of bits. When the data signal leaves the FM discriminator of the receiver, the preamble will be a sine oscillation having a frequency of 576 kHz, the bit rate of the digital signal being originally twice as high—viz. 1152 kbits/s. It is important in this case that any DC components are removed quickly during the preamble, so that the clock recovery is performed during the last part of the pre- amble. A clock recovery technique is described in the applicant's US patent application filed on the same day as the present application and claiming priority from British patent application 9602585.3 filed Feb. 8, 1996. This parallel US patent application is hereby incorporated by reference in the present application.

In the preferred embodiment, the DC compensation module of the invention, when used in connection with DECT, may be provided with a DC level hold device in the signal compensation path. The DC level hold device, controlled by a monitor device which monitors the periodic signal on the output of the DC compensation device, can thus hold the DC level on the output of the signal compensation path when correct compensation has been achieved. This means that the DC compensation value determined during the preamble is held at least until the termination of the current data burst. Thus, the DC compensation is not changed even if long sequences having the same bit value occur in the sync word or among data.

In practice, it is the clock recovery module which controls the DC compensation module. The bit error rate will be unacceptably high, if the signal from the FM discriminator contains a DC component.

The invention moreover concerns a portable telephone having a DC compensation module to receive a DECT signal having a periodic preamble and having a sequence of binary data in a data burst.

BRIEF DESCRIPTION OF THE DRAWINGS

The invention will be explained more fully below in connection with preferred embodiments and with reference to the drawing, in which.

DETAILED DESCRIPTION OF THE INVENTION

The invention will be explained more fully below in connection with DC compensation of a signal which is in accordance with the ETSI standards of cordless systems, such as DECT. The invention is not restricted to this specific use. IN a DECT signal, data are transmitted in frames in time slots. Each frame has sixteen initial, alternating bits (preamble), a sync. word likewise consisting of sixteen bits in a different, but well-known bit pattern, and subsequent data. When the data signal leaves the FM discriminator of the receiver, the preamble assumes the form of a periodic signal, it being a sine signal having a frequency of 576 kHz, the bit rate of the digital signal being originally twice as high—viz. 1152 kbits/s. It is important in this case that any DC components are removed quickly during the preamble so that the clock recovery may be performed during the last part of the preamble.

Figure 1:
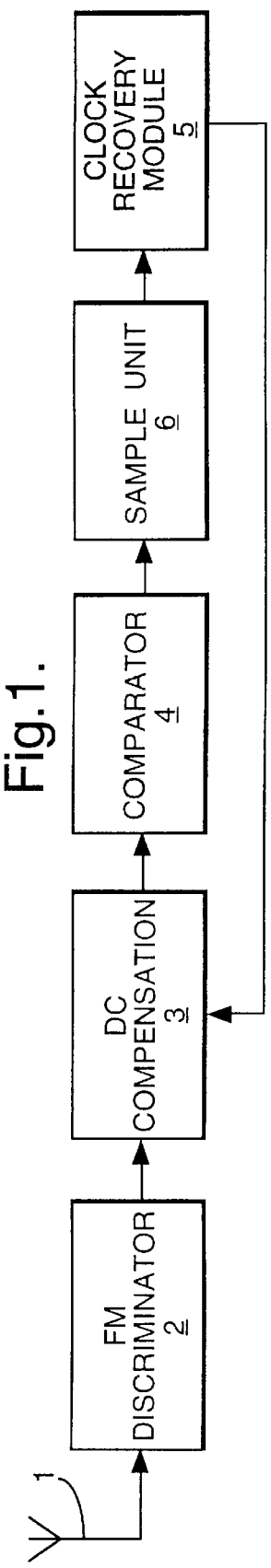
FIG. 1 schematically illustrates how a DC compensation module of the invention in a preferred embodiment is used in a portable telephone.

An example of how a DC compensation module of the invention is used in a portable telephone is shown in FIG. 1. A signal is received by an aerial 1, and the signal is passed via an FM discriminator 2 to a DC compensation module 3, where any DC content is removed. The signal is passed from the DC compensation module 3 to a comparator 4, where the signal is one bit quantized before being passed to a clock recovery module 5 via a sampling device 6.

The quantized signal is oversampled in the sampling device 6, and it is then correlated with a predetermined correlation word in the clock recovery module 5. The clock recovery module 5 determines the most expedient sampling time for the subsequent data bits on the basis of the preamble, which is GFSK modulated. On the basis of the correlation signal the clock recovery module 5 determines the most expedient time of holding the DC compensation level in the DC compensation module 5. Then, the DC compensation level is held at a constant value at least for the rest of the data burst.

Figure 2:
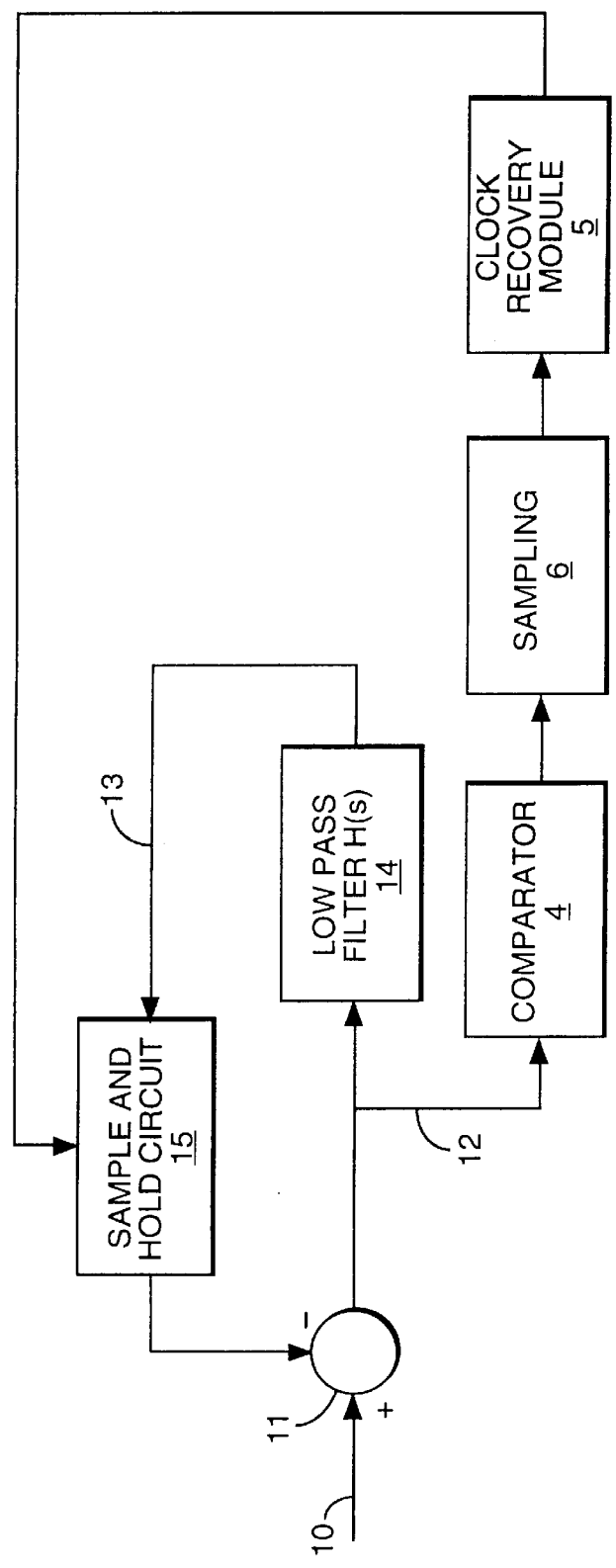
FIG. 2 shows a preferred embodiment of the DC compensation module of the invention, where the DC compensation module is constructed according to the feedback principle.

A preferred embodiment of a DC compensation module 3 of the invention is shown in FIG. 2. The signal received on the input of the module is passed via a signal transport path 10 to a combination unit in the form of a subtraction unit 11, in which a compensation signal is subtracted from the received signal and is then passed to the outlet 12 of the module. A signal compensation path 13 receives the difference signal from the output of the subtraction unit 11, and this difference signal is returned via a low pass filter 14 having the transfer function H(s) and a sample and hold circuit 15 as the compensation signal to the other input of the subtraction unit 11. The clock recovery module locks the DC correction level by means of the sample and hold circuit 15 for at least the rest of the databurst.

The low pass filter 14 may advantageously be a 2nd order low pass filter, and it has a notch at 576 kHz, which is the frequency of the periodic signal provided by the FM discriminator 2. The low pass filter may e.g. have a transfer function:

$$H(s) = k_1(s-z_1)(s-z_1^*)/s(s-p_1)(s-p_2),$$

where $k_1$ is a real constant, $z_1$ is an imaginary zero, $z_1^*$ is the complex conjugate of $z_1$, and $p_1$ and $p_2$ are two real values representing the poles of the filter. The actual values may thus be: $k_1 = 6.0 \times 10^5$, $z_1 = j3.62 \times 10^6$, $z_1^* = j3.62 \times 10^6$, and $p_1$ and $p_2$ are $-3.70 \times 10^6$ and $-3.57 \times 10^6$, respectively.

If the loop filter is too slow, a too great part of the preamble will be used for DC compensation, and the clock recovery will be poor, resulting in a high bit error rate. If the loop is too fast, the noise suppression will be too poor, and the DC compensation will be too imprecise.

Figure 3:
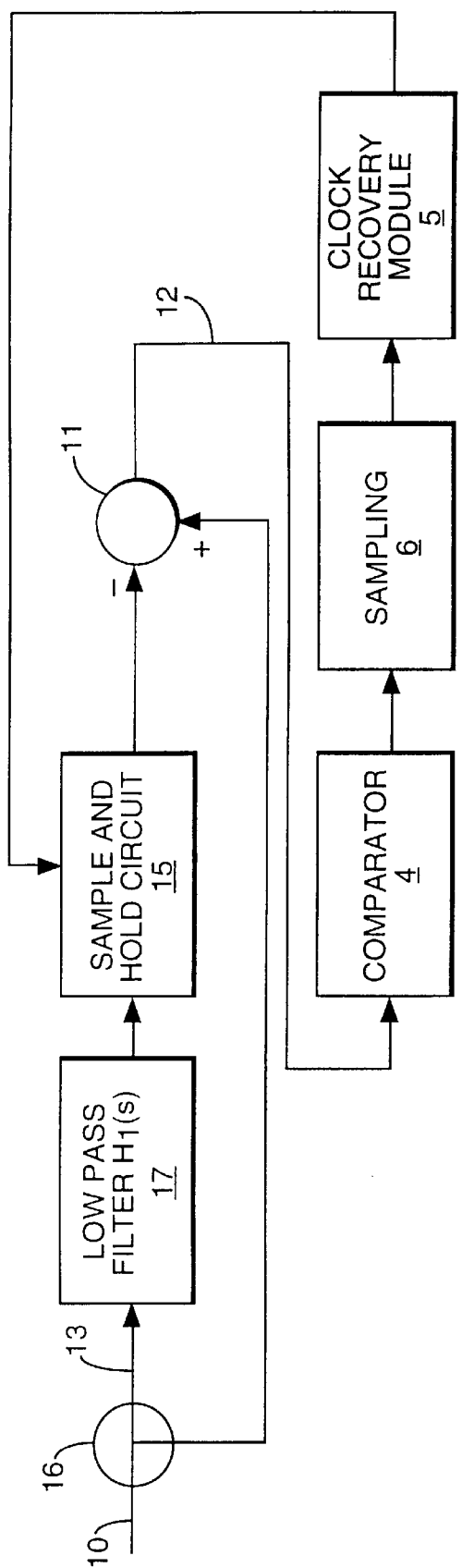
FIG. 3 shows an alternative embodiment of the DC compensation module according to the invention, where the DC compensation module is constructed according to the feed forward principle.

FIG. 3 shows an alternative embodiment of the DC compensation module of the invention, the DC compensation module being constructed here according to the feed forward principle. Thus, it will be seen that the signal received on the input of the module is passed via a signal transport path 10 to a combination unit in the form of a subtraction unit 11. A branch means 16 is provided in the signal transport path 10, diving the incoming signal so that a portion is passed to a signal compensation path 13 provided with a low pass filter 17 having a transfer function $H_1(s)$ and a sample and hold circuit 15. The compensation signal transferred via the signal compensation path 13 is passed to the subtraction unit 11, where it is subtracted from the received signal. The clock recovery module 5 locks the DC correction level by means of the sample and hold circuit for the rest of the data burst. The reference numbers of the components in the two embodiments are the same for essentially the same components.

In this embodiment the low pass filter 17 may have a transfer function:

$$H_1(s) = H(s)/(1-H(s)),$$

where H(s) is the transfer function of the low pass filter 14 in the embodiment shown in FIG. 2.

Figure 4:
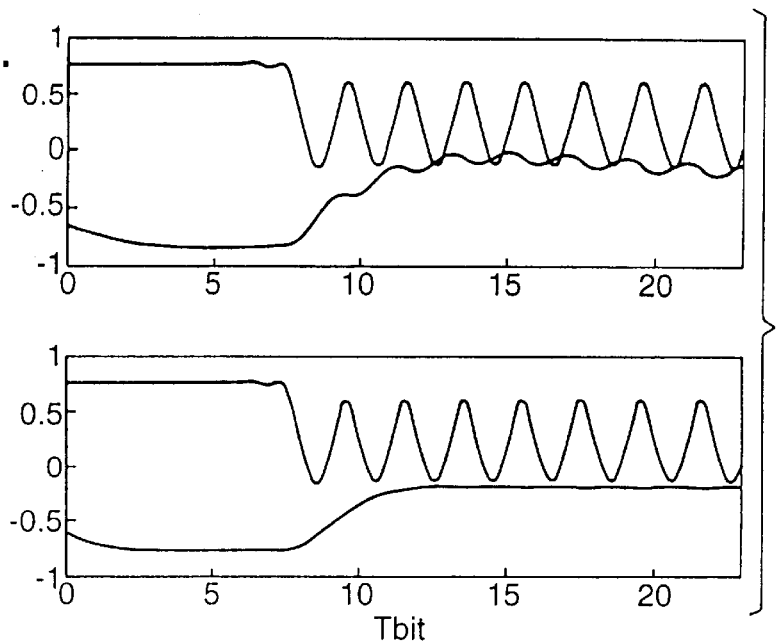
FIG. 4 shows the effect of the notch in the filter of the DC compensation module.

FIG. 4 shows the effect of the notch in the filter 14 in the first embodiment of the DC compensation module of the invention. The upper curve in both diagrams shows the signal (transferred via the signal transport path 10), which is received on the input of the DC compensation module, while the lower curve in the upper diagram shows the signal which would have been transferred via the signal compensation path 13 if the filter 14 had been without a notch. The lower curve in the lower diagram shows the signal which is transferred via the signal compensation path 13 when the filter 14 is provided with a notch. The filter is a 2nd order low pass filter in both cases.

It will be seen clearly from FIG. 4 that the notch makes it possible to eliminate the ripple which would otherwise occur if the notch had not been present. As long as this ripple is present, the sample and hold circuit 15 will introduce a DC error in response to the sampling time concerned. It will also be seen that the compensation signal on the signal compensation path 1 3 reaches its final, stable value after just 4–5 data bits.

Figure 5:
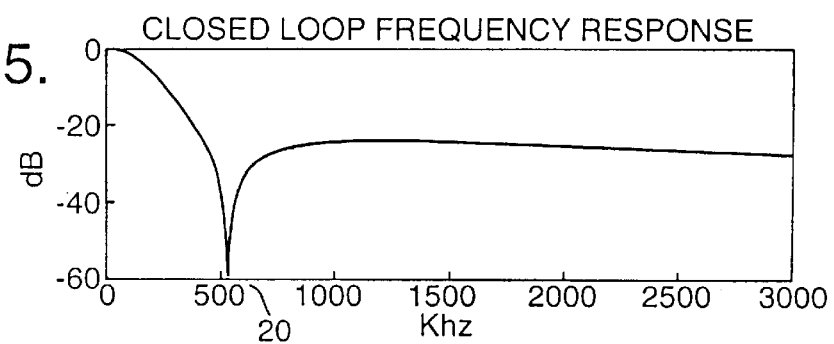
FIG. 5 shows the filter characteristic of a filter used in the DC compensation module shown in FIG. 2.
Figure 6:
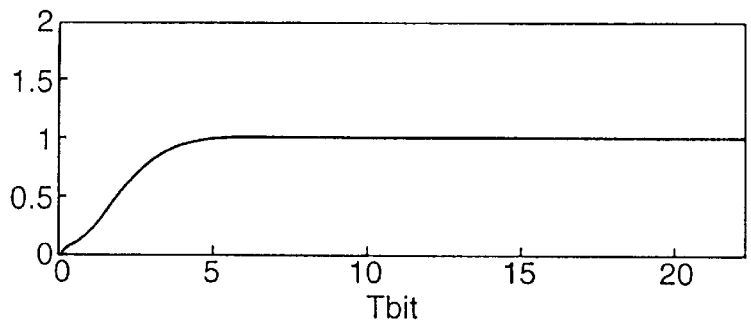
FIG. 6 shows a step response of the filter whose filter characteristic is shown in FIG. 5.

FIG. 5 shows the filter characteristic for the feed forward filter 14 used in the embodiment of the DC compensation module of the invention shown in FIG. 2. The notch 20 is seen clearly at 576 kHz. The step response of the filter is shown in FIG. 6.

Figure 7:
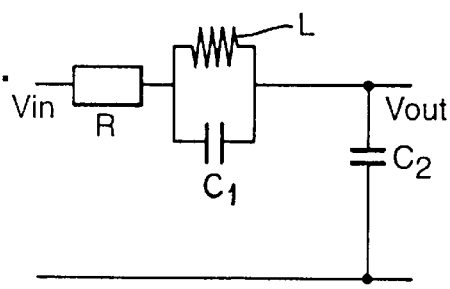
FIG. 7 shows an example of how the filter used in the embodiment shown in FIG. 3 may be realised.

FIG. 7 shows an example of how the filter 17 used in the alternative embodiment shown in FIG. 3 may be constructed. It will be seen that the filter 17 may be constructed very simply, as, in practice, it may comprise just a parallel coupling of an inductance L and a capacity $C_1$ serially connected to a resistor R, and with a further capacitor $C_2$ arranged above the output. The values of the components may be L=82 $\mu$H, $C_1$=1nF, R=150 $\Omega$, and $C_2$=12nF.

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention.

What is claimed is:

1. A DC compensation module for suppressing the DC content of a signal containing a periodic sequence, comprising a signal transport path, a signal compensation path and a combination unit, said signal transport path transferring the signal from the input of the module to an input on the combination unit, said signal compensation path being coupled to another input on the combination unit and comprising a low pass filter filtering a signal transferred via the signal compensation path, said low pass filter of the signal compensation path comprising a notch at a frequency corresponding to the period of the periodic signal, and said combination unit supplying an output signal in response to the difference between the signals received from the transport path and from the signal compensation path.

2. A DC compensation module according to claim 1, wherein the combination unit is a subtraction unit supplying, on the output, the difference between a signal received from the signal transport path and a signal from the signal compensation path, and wherein the signal from the output of the subtraction unit is fed back to the input of the subtraction unit via the signal compensation path.

3. A DC compensation module according to claim 1, wherein the low pass filter of the signal compensation path is a 2nd order low pass filter.

4. A DC compensation module according to claim 1, wherein the low pass filter has a transfer function:
$H(s)=k_1(s-z_1)(s-z_1^*)/s(s-p_1)(s-p_2)$, where $k_1$ is a real constant, $z_1$ is an imaginary zero, $z_1^*$ is the complex conjugate of $z_1$, and $p_1$ and $p_2$ are two real values.

5. A DC compensation module according to claim 1, further comprising a branch means for branching the signal on the signal transport path such that signals transferred via the signal transport path and the signal compensation path are passed to an input of a subtraction unit, and wherein the difference between the signal received from the signal transport path and the signal from the signal compensation path is supplied on an output of the subtraction unit.

6. A DC compensation module according to claim 5, wherein the low pass filter has a transfer function:

$$H_1(s)=H(s)/(1-H(s)),$$

where $H(s)=k_1(s-z_1)(s-z_1^*)/s(s-p_1)(s-p_2)$, where $k_1$ is a real constant, $z_1$ is an imaginary zero, $z_1^*$ is the complex conjugate of $z_1$, and $p_1$ and $p_2$ are two real values.

7. A DC compensation module according to claim 1, wherein the notch in the low pass filter of the signal compensation path is positioned at about 576 kHz.

8. A DC compensation module according in claim 1, wherein said DC compensation module forms a portion of a portable telephone and receives a DECT signal having a periodic preamble and a sequence of binary data in a data burst.

9. A DC compensation module for suppressing the DC content of a signal containing a periodic sequence, comprising a signal transport path, a signal compensation path and a combination unit, said signal transport path transferring the signal from the input of the module to an input on the combination unit, said signal compensation path being coupled to another input on the combination unit and comprising a low pass filter filtering a signal transferred via the signal compensation path, said low pass filter of the signal compensation path comprising a notch at a frequency corresponding to the period of the periodic signal, and said combination unit supplying an output signal in response to the difference between the signals received from the transport path and from the signal compensation path, wherein the signal compensation path is comprised of a DC level hold device controlled by a monitor device which monitors the periodic signal on the output of the DC compensation device.

10. A radiotelephone for communication via a wireless network and operable to receive a signal having a periodic preamble and a sequence of binary data in a data burst, said radiotelephone comprising a DC compensation module for suppressing a DC content of a signal containing a periodic sequence, said DC compensation module comprising:

a signal transport path;

a signal compensation path comprising a low pass filter having a notch at a frequency corresponding to the period of the periodic signal, and a combination unit having a first input for receiving the signal from the input of the DC compensation module transferred via said signal transport path, a second input for receiving the signal from said signal compensation path, and an output for supplying a signal in response to a difference between the signals on the first and the second inputs.

11. A radiotelephone according to claim 10, wherein the output signal from the combination unit is fed back to the input of the combination unit via the signal compensation path.

12. A radiotelephone according to claim 10, wherein the low pass filter of the signal compensation path is comprised of a second order low pass filter.

13. A radiotelephone according to claim 10, wherein said DC compensation module further comprises a branch connected to the input of the DC compensation module for branching the signal received and supplying the branched signal to the signal transport path and to the signal compensation path.

14. A radiotelephone according to claim 10, wherein the notch in the low pass filter is positioned at about 576 kHz.

15. A radiotelephone according to claim 10, wherein the signal compensation path is provided with a DC level hold device controlled by a monitor device which monitors the periodic signal on the output of the DC compensation device.

16. A radiotelephone according to claim 10, wherein the low pass filter has a transfer function given by:

$$H(s)=k_1(s-z_1)(s-z_1^*)/s(s-p_1)(s-p_2),$$

where $k_1$ is a real constant, $z_1$ is an imaginary zero, $z_1^*$ is the complex conjugate of $z_1$, and $p_1$ and $p_2$ are two real values.

17. A radiotelephone according to claim 10, wherein the low pass filter has a transfer function given by:

$$H_1(s)=H(s)/(1-H(s)),$$

where $H(s)=k_1(s-z_1)(s-z_1^*)/s(s-p_1)(s-p_2)$, where $k_1$ is a real constant, $z_1$ is an imaginary zero, $z_1^*$ is the complex conjugate of $z_1$ and $p_1$ and $p_2$ are two real values.

* * * * *